United States Patent
Barbieri et al.

(10) Patent No.: US 9,871,501 B2
(45) Date of Patent: Jan. 16, 2018

(54) RF CIRCUIT WITH MULTIPLE-DEFINITION RF SUBSTRATE AND CONDUCTIVE MATERIAL VOID UNDER A BIAS LINE

(71) Applicant: FREESCALE SEMICONDUCTOR, INC., Austin, TX (US)

(72) Inventors: Travis A. Barbieri, Phoenix, AZ (US); Basim H. Noori, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 240 days.

(21) Appl. No.: 14/746,173

(22) Filed: Jun. 22, 2015

(65) Prior Publication Data

US 2016/0373085 A1 Dec. 22, 2016

(51) Int. Cl.
*H03H 11/04* (2006.01)
*H01L 23/498* (2006.01)
(Continued)

(52) U.S. Cl.
CPC .............. *H03H 11/04* (2013.01); *H01L 23/13* (2013.01); *H01L 23/36* (2013.01); *H01L 23/49822* (2013.01); *H01L 23/66* (2013.01); *H01P 1/2039* (2013.01); *H01P 1/20345* (2013.01); *H01P 3/02* (2013.01); *H01P 11/001* (2013.01); *H01P 11/007* (2013.01); *H01P 11/008* (2013.01);
(Continued)

(58) Field of Classification Search
CPC ............... H01L 27/01; H01L 23/49822; H01P 1/20345; H03H 2001/0085; H03H 7/0115; H03H 11/04
USPC .................................................. 333/175, 185
See application file for complete search history.

(56) References Cited

U.S. PATENT DOCUMENTS 5,387,888 A * 2/1995 Eda .................... H01L 23/66
257/664
5,717,249 A 2/1998 Yoshikawa et al.
(Continued)

FOREIGN PATENT DOCUMENTS

DE 10 2012 213 324 A1 1/2014
EP 0 563 873 A2 10/1993
(Continued)

OTHER PUBLICATIONS

Jeong, S. G. et al. "Amplifier design using /spl lambda//4 high impedance bias line with defect ground structure (DGS)", IEEE MTT-S International Microwave Symposium Digest, vol. 2, pp. 1161-1164, Jun. 2002.

*Primary Examiner* — Rakesh Patel
(74) *Attorney, Agent, or Firm* — Sherry W. Schumm (57) ABSTRACT

An RF circuit includes a first dielectric material, a signal line and a bias line over a first surface of the first dielectric material, a conductive layer over a second surface of the first dielectric material, and a second dielectric material over the conductive layer. The first and second dielectric materials have different dielectric constants. The conductive layer includes a ground plane over which the signal line is formed. A conductive material void, with which a section of the bias line is aligned, is present in the second conductive layer. The RF circuit further includes a mounting area for an RF device. First ends of the signal line and the section of the bias line are located proximate to the mounting area to enable the signal line and the bias line to be electrically coupled with one or more leads of the RF device.

19 Claims, 7 Drawing Sheets

(51) Int. Cl.
- *H01L 23/66* (2006.01)
- *H01P 3/02* (2006.01)
- *H05K 1/02* (2006.01)
- *H01P 11/00* (2006.01)
- *H03F 1/02* (2006.01)
- *H03F 3/19* (2006.01)
- *H03H 7/01* (2006.01)
- *H01L 23/13* (2006.01)
- *H01L 23/36* (2006.01)
- *H03F 3/193* (2006.01)
- *H01P 1/203* (2006.01)

(52) U.S. Cl.
CPC ............ *H03F 1/0288* (2013.01); *H03F 3/19* (2013.01); *H03F 3/193* (2013.01); *H03H 7/0138* (2013.01); *H05K 1/024* (2013.01); *H05K 1/0253* (2013.01); *H01L 2223/665* (2013.01); *H01L 2223/6627* (2013.01); *H01L 2223/6655* (2013.01); *H01L 2224/48091* (2013.01); *H03F 2200/451* (2013.01); *H05K 1/025* (2013.01)

(56) References Cited

U.S. PATENT DOCUMENTS

| | | |
|---|---|---|
| 6,271,727 B1 | 8/2001 | Schmukler |
| 2014/0002213 A1 | 1/2014 | Clark et al. |

FOREIGN PATENT DOCUMENTS

| | | |
|---|---|---|
| EP | 0735605 B1 | 10/1996 |
| EP | 1 089 375 A2 | 4/2001 |

* cited by examiner

RF CIRCUIT WITH MULTIPLE-DEFINITION RF SUBSTRATE AND CONDUCTIVE MATERIAL VOID UNDER A BIAS LINE

TECHNICAL FIELD

Embodiments of the subject matter described herein relate generally to radio frequency (RF) circuits, and more particularly to RF amplifiers that include signal and bias lines on a circuit substrate.

BACKGROUND

RF amplifiers typically include bias circuitry configured to provide DC bias voltages to the amplifier transistor(s). To ensure that a significant amount of RF power is not lost through the bias circuitry, it is important to de-couple or isolate the RF circuitry from the DC bias circuitry. Isolation may be achieved, for example, by including a quarter wave (lambda/4) transmission line in the DC bias transmission line, with a reactive component at the end of the quarter wave line that resonates at the fundamental frequency of the RF circuitry. Ideally, using this configuration, the bias line emulates infinite impedance at frequencies near the fundamental frequency, thus isolating the bias circuitry at those frequencies. However, the characteristic impedance of the bias line limits the bandwidth of frequencies for which effective isolation may be achieved.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

As mentioned above, in a DC bias circuit for an RF amplifier, the characteristic impedance of the circuit's bias line limits the bandwidth of frequencies for which effective isolation from RF signals may be achieved. More specifically, the characteristic impedance of a bias line directly affects the isolation bandwidth. Thus, as the characteristic impedance of a bias line increases, the isolation bandwidth also increases. The characteristic impedance of a bias line could be increased, for example, by decreasing the cross-sectional area (e.g., width and/or height) of the bias line. However, this technique increases the bias line's resistance, and the bias line integrity may be compromised if exposed to relatively high current.

Alternatively, the characteristic impedance of the bias line could be increased by increasing the thickness of the substrate (e.g., the printed circuit board (PCB) or other substrate) on which the bias line is formed. However, in some circuits, the bias line is formed on the same substrate as the input/output RF signal lines to the amplifier's transistor, and the input/output RF signal lines are precisely optimized for a certain substrate definition (including the substrate thickness and dielectric constant). Accordingly, alteration of the substrate definition in order to increase the characteristic impedance of the bias line may decrease the RF amplifier performance.

As used herein, the term "substrate definition" refers to the layer stackup, layer materials, material characteristics (e.g., dielectric constant), layer thicknesses, and other features that define a particular cross-section of a substrate between the substrate's primary surfaces (i.e., top and bottom surfaces). Embodiments of the inventive subject matter include an RF circuit that includes a substrate with a first substrate definition in areas underlying RF signal lines, and a different second substrate definition in areas underlying DC bias lines. According to an embodiment, RF signal lines may be optimized for the first substrate definition. Further, the second substrate definition is configured so that the characteristic impedance of each bias line is higher than it would be if the bias line were formed over a portion of the substrate with the first substrate definition. In this manner, each bias line may provide more wideband isolation than is achievable using conventional bias line configurations.

Figure 1:
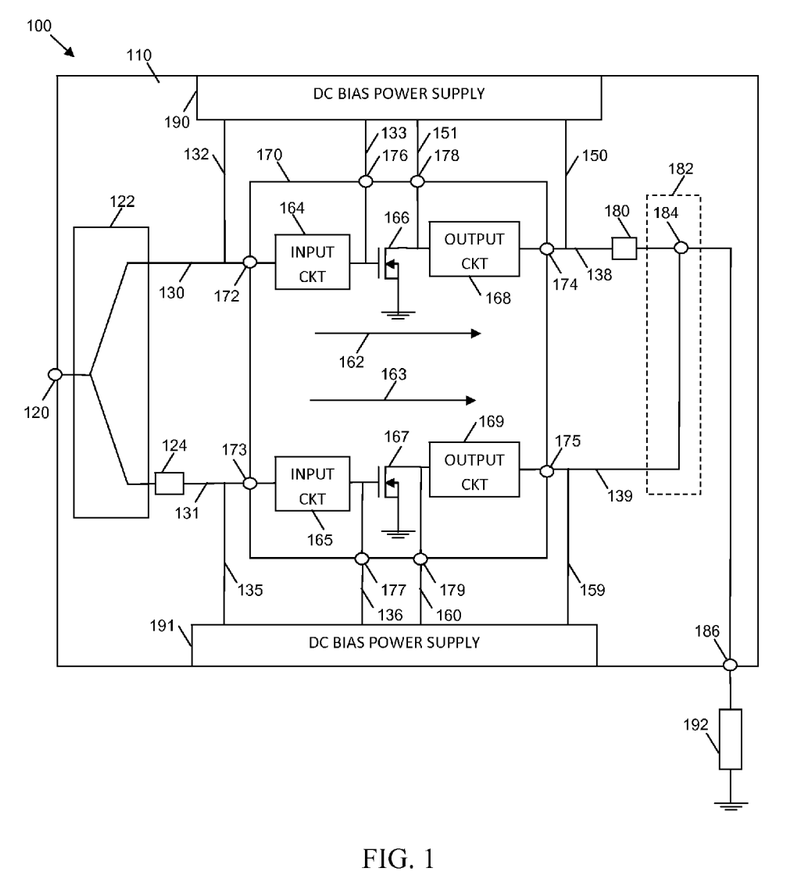
FIG. 1 is a schematic diagram of an RF amplifier, in accordance with an example embodiment.

The below-described RF substrate configurations may be used in any of a variety of different types of RF amplifiers or other RF circuits. For the purpose of explanation, a particular type of RF circuit in which various ones of the RF substrate embodiments may be included is described in conjunction with FIG. 1. More specifically, the RF circuit of FIG. 1 is a Doherty power amplifier that includes two amplifier paths (i.e., main and peaking paths). Those of skill in the art would understand, based on the description herein, that the various RF substrate embodiments described herein alternatively may be used in other types of RF circuits, including but not limited to other types of RF amplifiers, and/or RF amplifiers with more or fewer than two amplifier paths. In any event, the description of the RF substrate embodiments in the context of the Doherty power amplifier of FIG. 1 is provided to increase understanding of the inventive subject matter.

FIG. 1 is a schematic diagram of a Doherty power amplifier 100, in accordance with an example embodiment. Portions of amplifier 100 are formed on or supported by an RF substrate 110, embodiments of which will be described in more detail in conjunction with subsequently-described figures. RF substrate 110 may be referred to herein as a "multiple-definition" RF substrate, in that the RF substrate 110 has a first substrate definition in areas underlying input/output RF signal lines 130, 131, 138, 139, and a different second substrate definition in areas underlying DC bias lines 132, 133, 135, 136, 150, 151, 159, 160. Although particular components are illustrated as being coupled to RF substrate 110, it is to be understood that some of the components may be coupled to other substrates, and/or that more or different components may be coupled to RF substrate 110. As will be described in more detail later, at least one RF signal input line 130, 131, at least one RF signal output line 138, 139, and at least one DC bias line 132, 133, 135, 136, 150, 151, 159, 160 are formed on or otherwise supported by RF substrate 110, in an embodiment.

Essentially, Doherty amplifier 100 is configured to divide the power of an input RF signal into two signals, which are separately amplified along a main amplifier path 162 and a peaking amplifier path 163. The amplified signals are then re-combined to produce an amplified output RF signal. Various phase shifts are applied along the amplifier paths 162, 163 to enhance the performance of the amplifier 100. Further, DC bias voltages are applied along the amplifier paths 162, 163 to ensure that the amplifier transistors 166, 167 are appropriately biased, as will be described below.

Amplifier 100 includes an input node 120, an output node 186, a power divider 122, an RF device 170, and a power combiner 182, according to an embodiment. The RF device 170 is a discretely packaged component (e.g., an air-cavity or overmolded component), in an embodiment, which is electrically connected to external circuitry through various terminals (e.g., terminals 172-179) or "leads." The power divider 122 is coupled between input node 120 and input terminals 172, 173 to the RF device 170. The power combiner 182 is coupled between output terminals 174, 175 of the RF device 170 and output node 186. The output node 186 is coupled to a load 192 (e.g., an antenna).

During operation, the power divider 122 is configured to divide the power of an input signal received at node 120 into multiple portions of the input signal, where respective portions of the input signal are provided to RF signal input terminals 172, 173 of the RF device 170. For example, a first output of the power divider 122 may be coupled through a first RF signal input line 130 to an input terminal 172 corresponding to the main amplifier path 162, and a second output of the power divider 122 may be coupled through a second RF signal input line 131 to an input terminal 173 corresponding to the peaking amplifier path 163. The power divider 122 may divide the input power equally among the amplifier paths 162, 163, such that roughly half of the input signal power is provided to each amplifier path 162, 163. Alternatively, the power divider 122 may divide the power unequally.

As will be described in more detail below, each of the RF signals that the RF device 170 receives through input terminals 172, 173 are amplified, and the resultant amplified signals are output from the RF device 170 through RF signal output terminals 174, 175. Output terminals 174, 175 are coupled through first and second RF signal output lines 138, 139, respectively, to a summing node 184 of power combiner 182. The power of the amplified output RF signals is combined at summing node 184 to produce the final amplified RF signal at RF signal output node 186.

Along the peaking amplifier path 163, the amplifier 100 includes a first phase inversion element 124 between the second output of the power divider 122 and input terminal 173. For example, the first phase inversion element 142 may be implemented as a quarter wave transmission line (e.g., a 90 degree phase length transmission line) or a lumped element implementation of a 90 degree phase transformer. Along the main amplifier path 162, amplifier 100 includes a second phase inversion element 180 between output terminal 174 and the summing node 184 of the power combiner 182. As with the first phase inversion element 124, the second phase inversion element 180 may be implemented as a quarter wave transmission line (e.g., a 90 degree phase length transmission line) or a lumped element implementation of a 90 degree phase transformer. The output terminal 175 for the peaking amplifier path 163 also is coupled to the summing node 184, and the combination of phase inversion elements 124, 180 ensures that the currents ultimately provided to summing node 184 by the respective amplifier paths 162, 163 are provided substantially in-phase with each other. Accordingly, the current provided by summing node 184 to output node 186 (and to load 192) represents the in-phase summation of the currents provided by amplifier paths 162, 163.

The components of RF device 170 now will be described in more detail. Between corresponding sets of input/output RF terminals 172-175, each amplifier path 162, 163 includes an input impedance matching circuit (INPUT CKT) 164, 165 (or simply "input matching circuit"), one or more amplifier stages (depicted as transistors 166, 167), and an output impedance matching circuit (OUTPUT CKT) 168, 169 (or simply "output matching circuit") coupled in series between input terminals 172, 173 and output terminals 174, 175 of the RF device 170.

Each of the input matching circuits 164, 165 is configured to provide a desired input impedance at its respective input terminal 172, 173 at the fundamental frequency (or carrier frequency) of the amplifier 100. For example, each input matching circuit 164, 165 may be implemented as a low pass filter circuit, a high pass filter circuit, or a bandpass filter circuit, which may include various configurations of passive filter components (e.g., inductors, capacitors, and/or resistors).

Transistors 166, 167 include the primary active components of device 170. According to an embodiment, each transistor 166, 167 includes a control terminal and first and second current conducting terminals. For example, each of the transistors 166, 167 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, the transistors 166, 167 may be bipolar junction transistors (BJTs). Accordingly, references herein to a "gate," "drain," and "source," are not intended to be limiting, as each of these designations has analogous features for a BJT implementation (e.g., a base, collector, and emitter, respectively).

According to an embodiment, and using nomenclature typically applied to MOSFETs in a non-limiting manner, the gate of each transistor 166, 167 is coupled through an input matching circuit 164, 165 to an RF signal input terminal 172, 173, the drain of each transistor 166, 167 is coupled through an output matching circuit 168, 169 to an RF signal output terminal 174, 175, and the source of each transistor 166, 167 is coupled to ground (or another voltage reference). Through the variation of control signals (e.g., input RF signals) provided to the gate of each transistor 166, 167, the current between the current conducting terminals of the transistor 166, 167 is modulated. Although each amplifier stage is depicted as a single transistor 166, 167, it is to be understood that each amplifier stage alternatively may include multiple amplifier stages (e.g., a pre-amplifier stage and a primary amplifier stage), and/or multiple transistors arranged in parallel or series configurations. For ease of description, each of transistors 166, 167 will be referred to in the singular, below, although it is to be understood that each transistor 166, 167 may be replaced with a more complicated amplifier stage configuration.

According to various embodiments, amplifier 100 may be a symmetrical amplifier or an asymmetrical amplifier. Accordingly, the transistors 166, 167 may be symmetrical (i.e., substantially the same size) or asymmetrical (i.e., of different sizes). In the Doherty configuration, transistor 166 may be configured and operated as a main amplifier, and transistor 167 may be configured as and operated as a peaking amplifier. The main amplifier stage (including transistor 166) is configured as a Class AB amplifier, meaning that transistor 166 is biased to provide a conduction angle between 10 and 360 degrees. Conversely, the peaking amplifier stage (including transistor 167) is configured as a Class C amplifier, meaning that transistor 167 is biased to provide a conduction angle less than 10 degrees.

To appropriately bias transistors 166, 167, bias voltages are provided by one or more DC bias power supplies 190, 191 to transistors 166, 167 through various bias lines 132, 135, 150, 159 or 133, 136, 151, 160. According to an embodiment, each of bias lines 132, 135, 150, 159 directly connects to one of the RF signal input lines 130, 131 or the RF signal output lines 138, 139 at a connection point that is located outside of the RF device 170 (e.g., a connection point on RF substrate 110). More specifically, a first bias line 132 is connected to the first RF signal input line 130 to provide a DC gate bias voltage to transistor 166, and a second bias line 135 is connected to the second RF signal input line 131 to provide a DC gate bias voltage to transistor 167. Similarly, a third bias line 150 is connected to the first RF signal output line 138 to provide a DC drain bias voltage to transistor 166, and a fourth bias line 159 is connected to the second RF signal output line 139 to provide a DC drain bias voltage to transistor 167. An RF circuit that includes a four-lead RF device and four bias lines that are directly coupled to input/output RF signal lines is illustrated and described later in detail in conjunction with FIG. 7.

In the above-described configuration, the RF device 170 may exclude DC bias terminals 176-179, because the bias voltages may be received through the input/output RF signal terminals 172-175. In an alternate embodiment, however, the RF device 170 includes DC bias terminals 176-179 that are configured to receive and provide gate and drain DC bias voltages to transistors 166, 167. In such an embodiment, bias lines 132, 135, 150, 159 may be excluded from the RF circuit 100, and bias lines 133, 136, 151, 160 may be included instead. As illustrated in FIG. 1, a first bias line 133 is connected to a first gate bias terminal 176 of RF device 170, which in turn is electrically coupled within RF device 170 to the gate of transistor 166. Similarly, a second bias line 136 is connected to a second gate bias terminal 177 of RF device 170, which in turn is electrically coupled within RF device 170 to the gate of transistor 167. A third bias line 151 is connected to a first drain bias terminal 178 of RF device 170, which in turn is electrically coupled within RF device 170 to the drain of transistor 166. Similarly, a fourth bias line 160 is connected to a second drain bias terminal 179 of RF device 170, which in turn is electrically coupled within RF device 170 to the drain of transistor 167. An RF circuit that includes an eight-lead RF device with four input/output RF signal leads and four dedicated DC bias leads is illustrated and described later in detail in conjunction with FIG. 8.

Each of the output matching circuits 168, 169 is configured to provide a desired output impedance at its respective RF signal output terminal 174, 175 at the fundamental frequency of the amplifier 100. In various embodiments, each output impedance matching circuit 168, 169 may be implemented as a high pass filter circuit, a low pass filter circuit, or a bandpass filter circuit, which may include various configurations of passive filter components (e.g., inductors, capacitors, and/or resistors).

It should be understood that FIG. 1 is a simplified representation of an amplifier 100 for purposes of explanation and ease of description, and that practical embodiments may include other devices and components to provide additional functions and features, and/or the amplifier 100 may be part of a much larger electrical system, as will be understood. For example, as indicated previously, embodiments of devices discussed herein may be incorporated into amplifiers having a single amplifier path or more than two amplifier paths, as well as amplifiers having configurations other than Doherty configurations. Further, embodiments of devices discussed herein may be incorporated into RF circuits other than amplifiers, as well.

Figure 7:
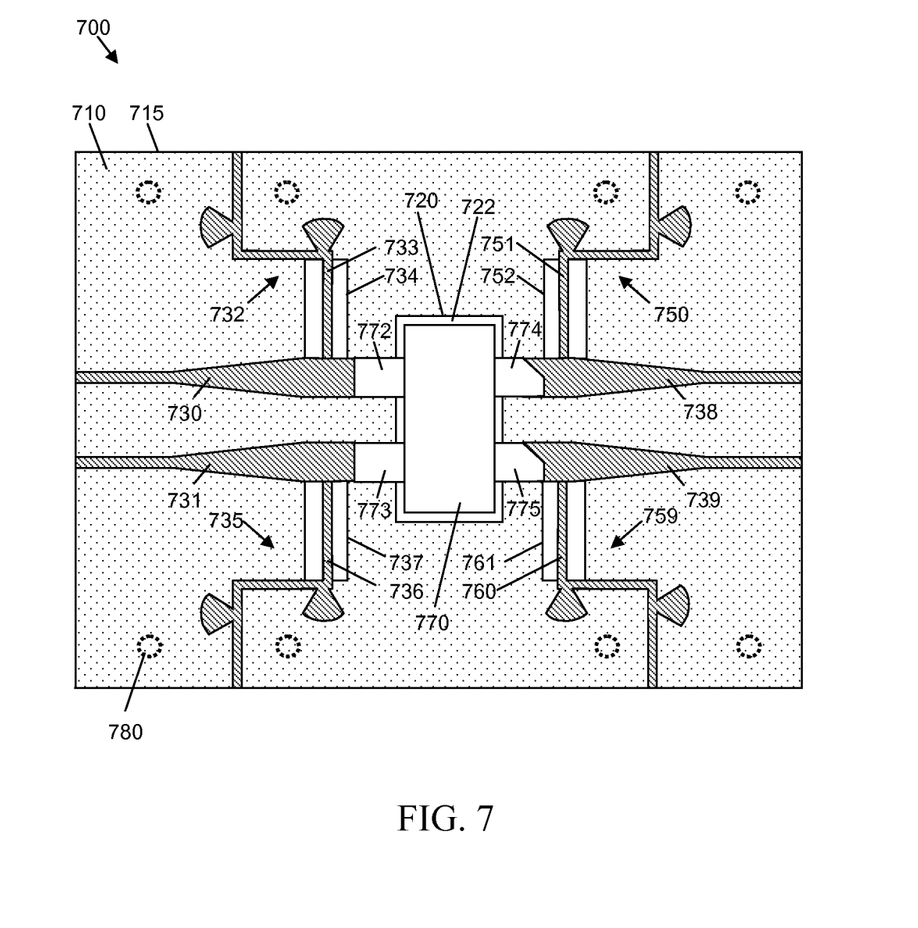
FIG. 7 is a top view of an RF circuit that includes an RF substrate with four signal and four bias lines, and a four-lead RF component mounted to a mounting area of the RF substrate, in accordance with another example embodiment.
Figure 8:
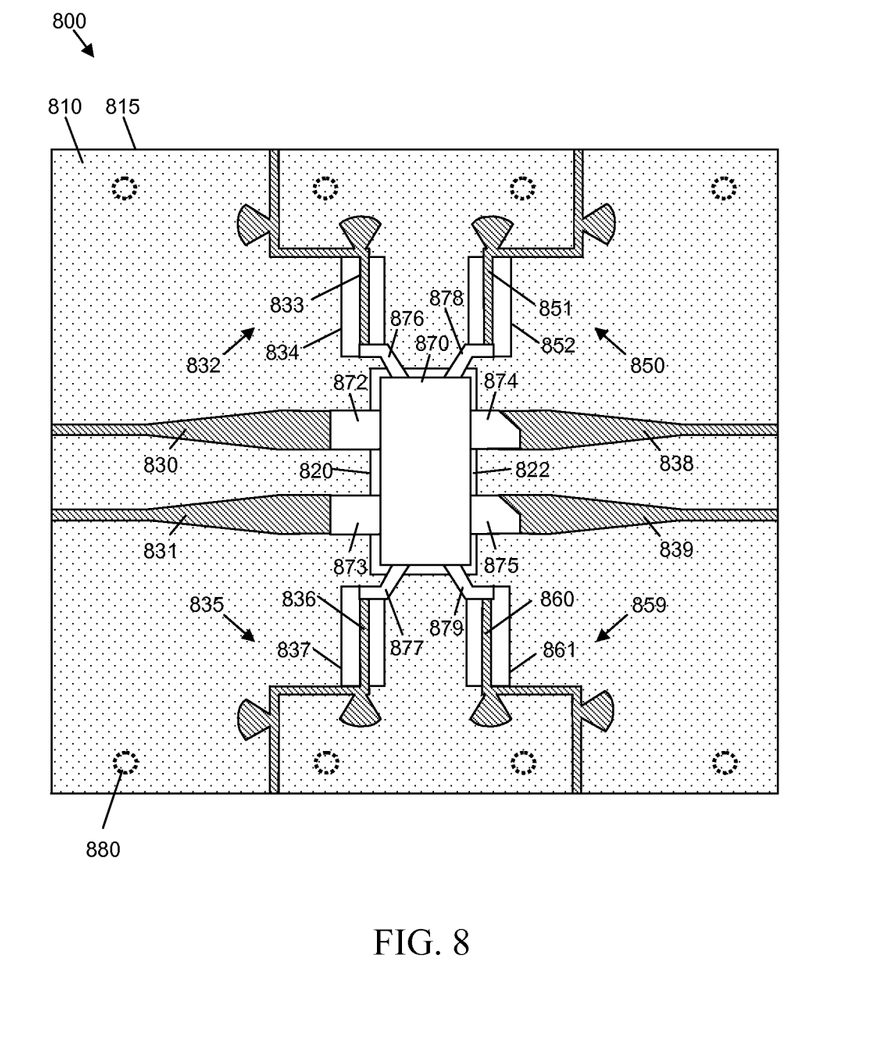
FIG. 8 is a top view of an RF circuit that includes an RF substrate with four signal and four bias lines, and an eight-lead RF component mounted to a mounting area of the RF substrate, in accordance with another example embodiment.

As described in detail above, the amplifier 100 of FIG. 1 includes two amplifier paths 162, 163 with two RF signal input lines 130, 131, two RF signal output lines 138, 139, and four DC bias lines 132, 135, 150, 159 or 133, 136, 151, 160. All of the input/output RF signal lines 130, 131, 138, 139 and the DC bias lines 132, 135, 150, 159 or 133, 136, 151, 160 are coupled to the RF substrate 110, in an embodiment. As will be described in detail below, and as indicated above, embodiments of the inventive subject matter include RF substrates with a first substrate definition in areas underlying RF signal lines (e.g., input/output RF signal lines 130, 131, 138, 139), and a different second substrate definition in areas underlying some or all of the DC bias lines (e.g., DC bias lines 132, 135, 150, 159 or 133, 136, 151, 160). FIGS. 2-8 illustrate top and cross-sectional views of several embodiments of RF substrates, which are configured to be included in a single-path RF circuit (FIG. 2), a two-path RF circuit with DC bias lines connected to input/output RF signal lines (FIG. 7), and a two-path RF circuit with DC bias lines connected to dedicated DC bias leads of an RF device (FIG. 8). For simplicity of illustration, FIGS. 2-8 illustrate only those portions of an RF circuit that are particularly pertinent to conveying the various embodiments of the inventive subject matter, including portions of RF substrate embodiments and RF devices attached to those substrates. It is to be understood that other features and components (e.g., power supplies, power dividers, power combiners, various discrete components, connectors, and so on) also may be physically and electrically coupled to the RF substrates and the RF devices illustrated in FIGS. 2-8. However, those other features and components are not depicted in FIGS. 2-8.

Figure 2:
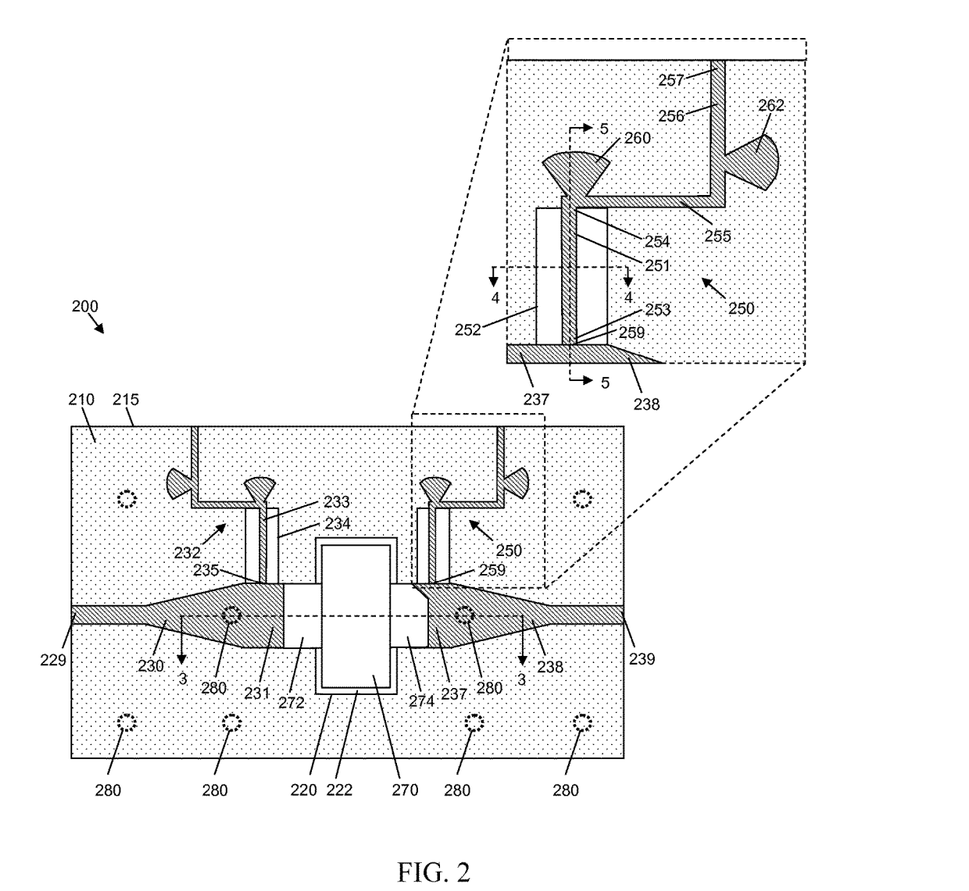
FIG. 2 is a top view of an RF circuit that includes an RF substrate with two signal lines and two bias lines, and a two-lead RF component mounted to a mounting area of the RF substrate, in accordance with an example embodiment.

Beginning with the simpler embodiment of a single-path RF circuit, FIG. 2 is a top view of a portion of an RF circuit 200, in accordance with an example embodiment. FIG. 2 should be viewed simultaneously with FIGS. 3-5, which illustrate cross-sectional side views of RF circuit 200 along lines 3-3, 4-4, and 5-5, respectively. Further, in FIG. 2, the portion of RF substrate 210 that includes DC bias line 250 is enlarged to better illustrate the features of the DC bias line 250. It is to be understood that the other DC bias line 232 may have similar features, in an embodiment.

Figure 3:
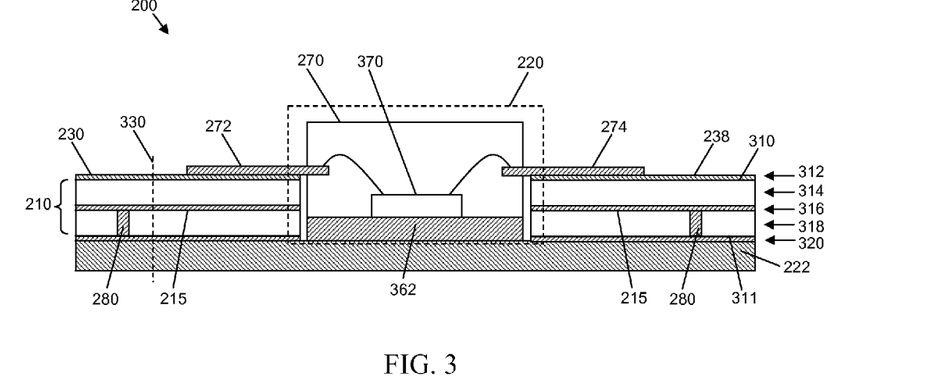
FIG. 3 is a cross-sectional, side view of the RF circuit of FIG. 2 along line 3-3.

Referring first to FIGS. 2 and 3 simultaneously, RF circuit 200 includes an RF substrate 210 coupled to a base plate 222, and a two-lead RF device 270 coupled to a mounting area 220 of the RF substrate 210. For example, the base plate 222 may be a conductive flange or other rigid structure, which may be configured to provide mechanical support to the RF substrate 210 (and other system components) and to serve as a heat sink for the RF device 270 (and other heat-generating components). Further, the base plate 222 may be used to provide a voltage reference (e.g., ground) for the RF circuit 200 and other system components.

RF substrate 210 is a multi-layer substrate, which includes at least one layer of a first dielectric material 314, at least one layer of a different second dielectric material 318, a first conductive layer 312 over a surface of the first dielectric material 314, and a second conductive layer 316 (referred to herein as an "inter-dielectric conductive layer") sandwiched between the first and second dielectric materials 314, 318. In a further embodiment, RF substrate 210 also includes a third conductive layer 320 over a surface of the second dielectric material 318, where the third conductive layer 320 may be used to facilitate physical and electrical connection of the RF substrate 210 to the base plate 222. For example, the third conductive layer 320 and the base plate 222 may be coupled together with solder, conductive epoxy, or another binding material. In an alternate embodiment, the third conductive layer 320 may be excluded, and the exposed surface of the second dielectric material 318 may be directly coupled to the base plate 222 (e.g., with a conductive epoxy).

Each of the conductive layers 312, 316, 320 may have a thickness in a range between about 50 microns and about 90 microns (e.g., about 70 microns), although they may be thicker or thinner, as well. According to an embodiment, and as will be described in more detail later, a plurality of conductive features (e.g., input/output RF signal lines 230, 238 and DC bias lines 232, 250) are formed from the first conductive layer 312. More specifically, the plurality of conductive features formed from the first conductive layer 312 may be microstrip conductive features, in an embodiment. Further, a ground plane 215 is formed from the second conductive layer 316. Although the ground plane 215 would be covered by the first dielectric material 314 in the top view of FIG. 2, the footprint of the ground plane 215 is indicated with shading to show that conductive material voids 234, 252 are present in the second conductive layer 316 and in the ground plane 215 in areas directly under the DC bias lines 232, 250. The significance of the conductive material voids 234, 252 will be discussed in detail later. In any event, the ground plane 215 is electrically coupled with the bottom substrate surface 311 and with the third conductive layer 320 (if included) through conductive vias 280, which extend between top and bottom surfaces of the second dielectric material 318. Example locations of the conductive vias 280 are indicated in FIG. 2 with dashed circles. It is to be understood that, in alternate embodiments, an RF substrate may include more or fewer conductive vias 280 to electrically couple the ground plane 215 with the bottom substrate surface 311, and/or the conductive vias 280 may be located in different positions than those illustrated in FIG. 2.

According to an embodiment, the first dielectric material 314 has a thickness in a range of about 0.5 millimeters (mm) to about 0.75 mm between its top and bottom surfaces, and the second dielectric material 318 has a thickness in a range of about 5.0 mm to about 7.5 mm between its top and bottom surfaces, although the first and/or second dielectric materials 314, 318 may be thicker or thinner, as well. The dielectric constants of the first and second dielectric materials 314, 318 are significantly different from each other, in an embodiment. More specifically, the dielectric constant of the second dielectric material 318 is at least 50 percent less than the dielectric constant of the first dielectric material 314, in an embodiment. For example, the dielectric constant of the first dielectric material 314 may be in a range of about 4.0 to about 12.0 (e.g., about 6.5), and the dielectric constant of the second dielectric material 318 may be in a range of about 1.0 to about 4.0 (e.g., about 2.5), in an embodiment, although the dielectric constants may fall above or below these ranges, as well. The first and second dielectric materials 314, 318 each may be formed from a single layer of dielectric material, or may be formed from multiple layers of dielectric material. In the latter case, each of the multiple layers may be formed from a same material or from different materials. In embodiments in which either of the first and/or second dielectric materials 314, 318 is a multi-layer structure formed from different dielectric constant materials, the dielectric constant of the first and/or second dielectric material 314, 318 may be considered to be the effective dielectric constant of the multi-layer structure.

According to various embodiments, the first dielectric material 314 includes one or more materials selected from ceramic-filled polytetrafluoroethylene (PTFE), ceramic-filled PTFE with woven glass, ceramic-filled hydrocarbon, ceramic-filled hydrocarbon with woven glass, random glass filled PTFE, PTFE with woven glass, PTFE with micro glass fiber, e-fibre glass, high performance FR4, and other suitable materials. Also according to various embodiments, the second dielectric material 318 includes one or more materials selected from PTFE, ceramic-filled PTFE, ceramic-filled PTFE with woven glass, ceramic-filled hydrocarbon, ceramic-filled hydrocarbon with woven glass, random glass filled PTFE, PTFE with woven glass, PTFE with micro glass fiber, high performance FR4, other suitable materials, and air.

A first surface 310 of the RF substrate 210 (referred to herein as the top substrate surface 310) is defined by the surface of the first dielectric material 314 to which the first conductive layer 312 is coupled, and a second surface 311 of the RF substrate 210 (referred to herein as the bottom substrate surface 311) is defined by the surface of the second dielectric material 318 to which the third conductive layer 320 (if included) is coupled.

RF device 270 is electrically and mechanically coupled to a mounting area 220 of the RF substrate 210. Referring specifically to FIG. 3, RF device 270 may be a packaged device that includes an RF signal input lead 272, an RF signal output lead 274, and an RF circuit coupled between the input and output leads 272, 274. For example, the RF circuit within RF device 270 may include one or more integrated circuits (ICs), one or more discrete components, one or more integrated passive devices, and so on, which are electrically coupled to the input and output leads 272, 274 (and to each other) with wirebonds and/or other conductive structures. For convenience, the RF circuit is depicted in FIG. 3 as a single IC 370. However, it is to be understood that embodiments of RF circuits may include more than just a single IC, including any or all of the above-listed components. In a particular embodiment, the RF circuit includes at least one input impedance matching circuit (e.g., input matching circuit 164, FIG. 1), at least one power transistor (e.g., transistor 166, FIG. 1), and at least one output impedance matching circuit (e.g., output matching circuit 168, FIG. 1), which are electrically coupled between the input and output leads 272, 274 (e.g., corresponding to input and output terminals 172, 174, FIG. 1, respectively).

RF device 270 also may include a conductive flange 362 or PCB to which the IC 370 and other components of RF device 270 are coupled. The flange 362 is configured to provide mechanical support to the IC 370 (and other device components) and to serve as a heat sink and/or voltage reference plane for the IC 370 (and other device components). The flange 362, the RF circuit (including IC 370), and the leads 272, 274 are packaged together in an air-cavity or overmolded package, in various embodiments.

In the embodiment illustrated in FIG. 3, leads 272, 274 extend perpendicularly from the sides of RF device 270 at locations above the flange 362 top surface. In order to facilitate direct mechanical, electrical, and thermal coupling of the flange 362 to the base plate 222, RF substrate 210 may include an opening between the top and bottom substrate surfaces 310, 311, where the opening exposes the top surface of the base plate 222 and is sized to accommodate the RF device 270. In such an embodiment, the opening in the RF substrate 210 corresponds to the mounting area 220 for the RF device 270. In an alternate embodiment, the RF substrate 210 may include a conductive coin or other structure within the aforementioned opening. In such an embodiment, a bottom surface of the conductive coin may be coupled to the base plate 222, and the flange 362 of the RF device 270 may be coupled to a top surface of the conductive coin, where the top surface of the conductive coin corresponds to the mounting area for the RF device 270. Further, in such an embodiment, the leads 272, 274 of the RF device 270 may be positioned and/or shaped to facilitate coupling distal ends of the leads 272, 274 with the RF signal lines 230, 238 on the top substrate surface 310. In still other alternate embodiments, the RF substrate 210 may include conductive vias that extend between the top and bottom substrate surfaces 310, 311. In such an embodiment, the RF device 270, or more specifically the flange 362, may be coupled to the ends of the conductive vias that are exposed at the top substrate surface 310, and the portion of the substrate top surface 310 to which the RF device 270 is coupled corresponds to the mounting area for the RF device 270. The opposite ends of the conductive vias that are exposed at the bottom substrate surface 311 may be coupled to third conductive layer 320 and/or the base plate 222. RF device 270 may be electrically, mechanically, and thermally coupled to the RF substrate 210 and/or base plate 222 in other ways, as well.

According to an embodiment, various conductive structures (e.g., microstrip features) formed from the first conductive layer 312 are configured to carry RF signals and DC bias voltages to the RF device 270. More specifically, in the embodiment illustrated in FIGS. 2-5, these conductive structures include an RF input signal line 230, RF output signal line 238, a DC gate bias line 232, and a DC drain bias line 250. According to an embodiment, the RF input signal line 230 and the DC gate bias line 232 join at a connection point 235 along a side of the RF input signal line 230, and the RF output signal line 238 and the DC gate bias line 250 join at a connection point 259 along a side of the RF output signal line 238.

The RF input signal line 230 has first and second ends 229, 231, where the first end 229 is configured to receive an input RF signal from other circuitry (not shown in FIG. 2), and the second end 231 is configured to be coupled to the RF signal input lead 272 of the RF device 270. The RF input signal line 230 may be tapered so that the RF input signal line 230 is significantly narrower at the first end 229 than at the second end 230. For example, the RF input signal line may have a Klopfenstein taper shape, or some other linear or curved tapered shape. Alternatively, the RF input signal line may be substantially straight (e.g., approximately equal in width between its first and second ends 229, 231), or may have a serpentine or other shape.

Similarly, the RF output signal line 238 has first and second ends 237, 239, where the first end 237 is configured to be coupled to the RF signal output lead 274 of the RF device 270, and the second end 239 is configured to provide an output RF signal to other circuitry (not shown in FIG. 2). The RF output signal line 238 also may be tapered so that the RF output signal line 238 is significantly wider at the first end 237 than at the second end 239. For example, the RF input signal line may have a Klopfenstein taper shape, some other linear or curved tapered shape, a substantially straight shape, a serpentine shape, or some other shape.

Each of the DC bias lines 232, 250 may have one or multiple sections, and may include or be coupled to one or more passive circuit structures or components, as will be described in more detail below. As illustrated more clearly in the enlarged representation of DC bias line 250, each of the DC bias lines 232, 250 includes at least an elongated first section 233, 251, with a proximal end (e.g., end 253) that is directly coupled to an RF signal line 230, 238 at a connection point 235, 259. To de-couple the input/output RF signal lines 230, 238 from the DC bias circuitry, each first section 233, 251 is approximately a quarter wave (lambda/4) transmission line at the fundamental frequency of the RF circuit 200.

To enhance isolation, and to provide a first filter pole at approximately the fundamental frequency of the RF circuit 200, a first resonant circuit (or a first reactive component) may be coupled to each DC bias line 232, 250 at the distal end (e.g., end 254) of each first section 233, 251. According to an embodiment, the first resonant circuits are configured to resonant at a frequency that is at or near the fundamental frequency of the RF circuit 200. For example, as illustrated in FIG. 2, each first resonant circuit may include a radial stub (e.g., radial stub 260). In alternate embodiments, either or both of the first resonant circuits may include one or more discrete capacitors, inductors, resistors, and/or other passive components. In any event, each first resonant circuit essentially functions as a short circuit at its resonant frequency (e.g., at or near the fundamental frequency of the RF circuit 200). Because each first resonant circuit is positioned at the distal end of a quarter wave transmission line (e.g., at the distal ends of the first sections 233, 251 of the DC bias lines 232, 250), the combination of the quarter wave transmission line (e.g., the first sections 233, 251) and the first resonant circuit (e.g., radial stub 260) functions as an open circuit for RF signals at or near the fundamental frequency of the RF circuit 200. In other words, the combination presents a very high impedance to RF signals at the fundamental frequency.

According to an embodiment, each of the DC bias lines 232, 250 also may include elongated second and third sections (e.g., sections 255, 256) coupled in series to the distal end (e.g., end 254) of each first section 233, 251. To provide a second filter pole at approximately the fundamental frequency of the RF circuit 200, a second resonant circuit (or reactive component) may be coupled to each DC bias line 232, 250 at a junction between each second and third section (e.g., the junction between sections 255, 256). The second resonant circuits may be configured also to resonate at a frequency that is at or near the fundamental frequency of the RF circuit 200 but still within the frequency band of interest (e.g., the resonant frequency of the second resonant circuits may be offset from the resonant frequency of the first resonant circuit, but still within the band of interest). For example, as illustrated in FIG. 2, each second resonant circuit may include a radial stub (e.g., radial stub 262), although the second resonant circuits alternatively may include one or more discrete capacitors, inductors, resistors, and/or other passive components. The electrical length between the distal end of the first section 233, 251 and the second resonant circuit (including contributions from the first resonant circuit and the second section 255) again may correspond to a quarter wave transmission line for RF signals, thus presenting an even higher impedance of the DC bias lines 232, 250 to RF signals.

As mentioned previously, the characteristic impedance of an RF circuit's bias line limits the bandwidth of frequencies for which effective isolation from RF signals may be achieved. Accordingly, higher impedance bias lines are desired in order to increase the isolation bandwidth. According to various embodiments, the characteristic impedance of each DC bias line, and more specifically the first sections 233, 251 of the DC bias lines 232, 250, is increased significantly when compared with conventional circuits. Thus, the effective impedance of the DC bias lines 232, 250 seen by RF signals carried on the input/output RF signal lines 230, 238 at frequencies other than the fundamental (or quarter wave) frequency is also increased. According to an embodiment, the characteristic impedance of the DC bias lines 232, 250 is in a range of about 75 ohms to about 300 ohms at a frequency in a range of about 800 megahertz to about 6.0 gigahertz. In alternate embodiments, the characteristic impedance of the DC bias lines 232, 250 may be greater or smaller than the above-given range.

According to an embodiment, the characteristic impedance of the DC bias lines 232, 250 is increased by significantly decreasing the effective dielectric constant of the portion of the RF substrate 210 to which the DC bias lines 232, 250 are coupled, when compared with the effective dielectric constant of the portion of the RF substrate 210 to which the input/output RF signal lines 230, 238 are coupled. This is achieved, in an embodiment, by providing a different substrate definition below the DC bias lines 232, 250 than the substrate definition that is present below the input/output RF signal lines 230, 238. According to a specific embodiment, the substrate definition below the DC bias lines 232, 250 differs in that conductive material voids 234, 252 in the ground plane 215 are present below the DC bias lines 232, 250. Referring to FIG. 3, it can be seen that the substrate definition below the input/output RF signal lines 230, 238 (e.g., the substrate definition along cross-sectional cut 330) includes the first dielectric material 314, the second conductive layer 316, and the second dielectric material 318. Accordingly, between the input/output RF signal lines 230, 238 and the ground plane 215, the dielectric constant corresponds to the dielectric constant of the first dielectric material 314. In contrast, referring to FIG. 4, it can be seen that the substrate definition below the DC bias line 251 (e.g., the substrate definition along cross-sectional cut 430) includes the first dielectric material 314 and the second dielectric material 318. A conductive material void 252 is present in the second conductive layer 316 below the DC bias line 251 (i.e., the second conductive layer 316 is not present in the substrate definition below the DC bias line 251). Correspondingly, the "ground plane" for the DC bias lines 232, 250 is the third conductive layer 320 and/or the base plate 222, rather than ground plane 215. Accordingly, between the DC bias lines 232, 250 and their ground plane (e.g., third conductive layer 320), the dielectric constant corresponds to the dielectric constant of both the first dielectric material 314 and the second dielectric material 318. As discussed previously, the dielectric constant of the second dielectric material 318 is significantly lower than the dielectric constant of the first dielectric material 314. Accordingly, the effective dielectric constant of material between the DC bias lines 232, 250 and their ground plane (e.g., third conductive layer 320) is significantly lower than the dielectric constant of material between the input/output RF signal lines 230, 238 and their ground plane 215. In this manner, the isolation of the DC bias lines 232, 250 is significantly higher, when compared with conventionally designed DC bias lines and RF circuits.

Figure 4:
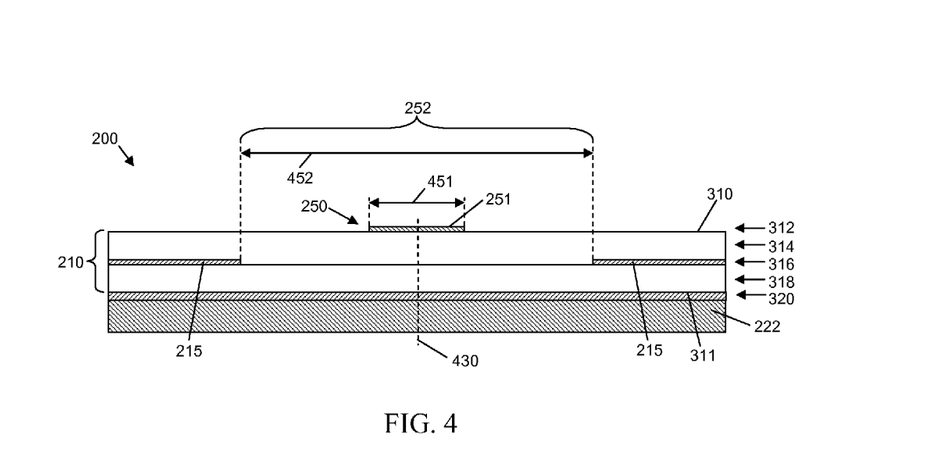
FIG. 4 is a cross-sectional, side view of the RF circuit of FIG. 2 along line 4-4.
Figure 5:
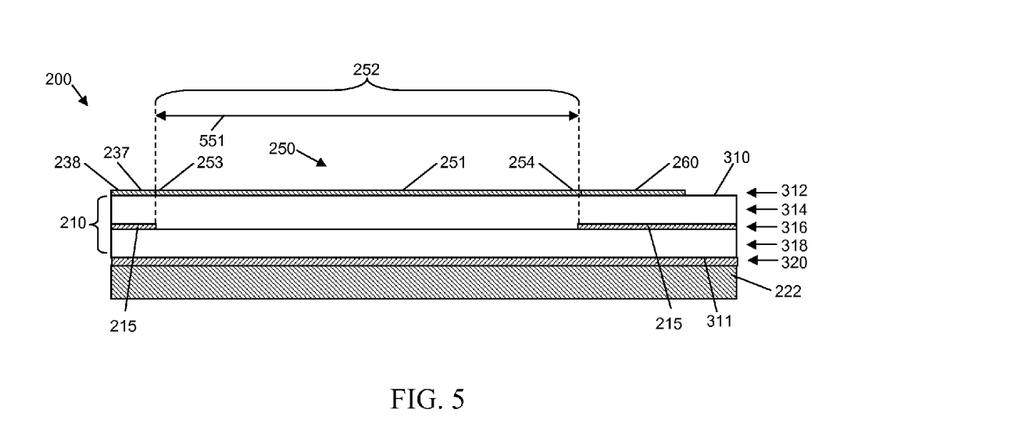
FIG. 5 is a cross-sectional, side view of the RF circuit of FIG. 2 along line 5-5.

FIGS. 4 and 5, which are cross-sectional views through lines 4-4 and 5-5, respectively, of DC bias line 250 (FIG. 2) further depict the arrangement of conductive material void 252 with respect to DC bias line 250. Referring to FIG. 4, it can be seen that the first section 251 of DC bias line 250 has a width 451 that is significantly less than the width 452 of the conductive material void 252 underlying the first section 251 of the DC bias line 250. According to an embodiment, width 452 is at least 20 percent wider than width 451. For example, the width 451 of the first section 251 of the DC bias line 250 may be in a range of about 25 mils to about 75 mils (e.g., about 50 mils), and the width 452 of the conductive material void 252 may be in a range of about 200 mils to about 400 mils (e.g., about 300 mils), although the widths 451, 452 may be wider or narrower, as well. In alternate embodiments, the widths 451, 452 may be substantially equal to each other, or may have proportions that are different from the illustrated or above-specified proportions.

Referring to FIG. 5, the length 551 of the first section 251 of the DC bias line 250 may be in a range of about 6.5 mm to about 19.0 mm, although the first section 251 may be longer or shorter, as well. More specifically, the length 551 of the first section 251 of the DC bias line 250 may be determined based on the wavelength of the substrate at the center frequency of the design, where the length should correspond to about a quarter wavelength. For example, for a center frequency of about 3.5 gigahertz (GHz), the length 551 may be about 12.7 mm. For higher center frequencies, the length 551 may be shorter, and for lower center frequencies, the length 551 may be longer. It can be seen that the lengths 551 of the first section 251 of the DC bias line 250 and the conductive material void 252 may be substantially equal, meaning that the conductive material void 252 is present below substantially an entire length of the first section 251. In alternate embodiments, the conductive material void 252 may be present under only a portion of the first section 251, or the conductive material void 252 may be present under the other sections 255 and/or 256 of the DC bias line 250.

Figure 6:
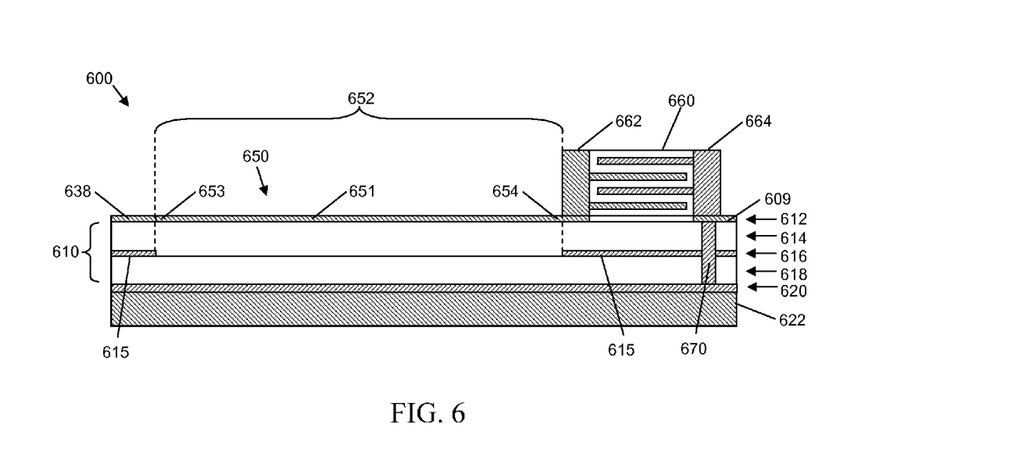
FIG. 6 is a cross-sectional, side view of another embodiment of an RF circuit that includes a discrete passive component electrically coupled to a bias line, in accordance with an alternate embodiment.

As discussed previously, and as can be seen in FIGS. 2 and 5, a resonant circuit coupled to the distal end 254 of the first section 251 of the DC bias line 250 may be a radial stub 260, which also is a microstrip component. As also discussed previously, an alternate embodiment of a resonant circuit may include one or more discrete components. For example, FIG. 6 is a cross-sectional, side view of another embodiment of an RF circuit 600 that includes a discrete passive component 660 electrically coupled to a bias line 651, in accordance with an alternate embodiment. The cross-sectional view of FIG. 6 is taken in the same location as the cross-sectional view of FIG. 5 (e.g., along line 5-5 of FIG. 2). Accordingly, FIG. 6 also depicts an RF substrate 610 coupled to a base plate 622, where the RF substrate 610 includes first and second dielectric materials 614, 618, and first, second, and third conductive layers 612, 616, 620, each of which may have substantially similar characteristics as the analogous dielectric materials 314, 318 and conductive layers 312, 316, 320 previously described. In addition, the RF circuit 600 may include a bias line 650 with a first section 651 (e.g., a quarter wave transmission line), under which a conductive material void 652 is present in the second conductive layer 616 (or in ground plane 615). A proximal end 653 of the first section 651 is coupled to an RF signal line 638 (e.g., similar input or output RF signal lines 230, 238), and a distal end 654 of the first section 651 is coupled to other sections (not illustrated) of the DC bias line 650. In addition, the distal end 654 of the first section 651 is coupled to a resonant circuit (or reactive component).

In contrast to the embodiments described in conjunction with FIGS. 2-5, rather than including a radial stub (e.g., radial stub 260) in the resonant circuit, the embodiment of FIG. 6 includes a discrete, multi-layer capacitor 660 in the resonant circuit. The capacitor 660 includes first and second terminals 662, 664, which are electrically coupled to first and second capacitor electrodes, respectively. The first capacitor terminal 662 is coupled to the distal end 654 of the first section 651 of the DC bias line 650, and the second capacitor terminal 664 is electrically coupled to a ground reference (e.g., ground plane 615 and/or base plate 622) through a contact pad 609 and one or more conductive vias 670 extending through dielectric materials 614, 618. The resonant circuit that includes capacitor 660 and additional resistances and inductances inherent in the conductive vias 670 and/or other portions of the resonant circuit is configured to resonate at or near the fundamental frequency of the RF circuit 600. Other embodiments may include resonant circuits having configurations other than those depicted in FIGS. 2-6.

The RF circuit 200 of FIG. 2 is configured for a two-lead RF device 270 with one input RF signal lead 272 and one output RF signal lead 274. As mentioned previously, other RF circuits may include RF devices with more than one input RF signal lead and/or more than one RF output signal lead (e.g., including two or more input and/or output signal leads). For example, an embodiment of such an RF device is depicted in FIG. 7, which is a top view of an RF circuit 700 that includes a four-lead RF device 770, and an RF substrate 710 with two input RF signal lines 730, 731, and two output RF signal lines 738, 739. Further, the RF circuit 700 includes and four DC bias lines 732, 735, 750, 759 coupled to the input/output RF signal lines 730, 731, 738, 739. Many of the features of RF circuit 700 are substantially similar to analogous features of FIGS. 2-5, and for the purpose of brevity, many details regarding analogous features are not repeated in the description of FIG. 7. It is to be understood that those details also apply to the features of FIG. 7. In addition, the various alternate embodiments described in conjunction with FIGS. 2-5 also apply to the RF circuit 700 of FIG. 7.

RF substrate 710 is a multi-layer substrate, the stackup of which includes at least a first conductive layer (analogous to layer 312 and from which signal and bias lines 730, 731, 732, 735, 738, 739, 750, 759 are formed), a first dielectric material (analogous to dielectric material 314), a second conductive layer (analogous to layer 316), and a second dielectric material (analogous to dielectric material 316). The second conductive layer (or inter-dielectric conductive layer) provides a ground plane 715, the footprint of which is indicated with shading in FIG. 7. Conductive vias 780 may be electrically coupled to the ground plane 715, and may extend through the second dielectric material to the bottom substrate surface. The RF substrate 710 may be coupled to a base plate 722 (analogous to base plate 222).

The RF circuit 700 also includes an RF device 770 with four leads 772, 773, 774, 775, which is mounted to a mounting area 720 of the substrate 710. More specifically, the RF device 770 may be inserted into an opening in the substrate 710 so that a flange (not illustrated) of the RF device 770 may be electrically and thermally coupled to a base plate 722 that supports the substrate 710. Leads 772, 773, 774, 775 of the RF device 770 are electrically coupled to a first input RF signal line 730, a second input RF signal line 731, a first output RF signal line 738, and a second output RF signal line 739, respectively. The RF device 770 may, for example, include RF circuitry corresponding to two amplifier paths (e.g., amplifier paths 162, 163, FIG. 1), where an amplifier path is electrically coupled between each pair of input/output RF leads (e.g., a first amplifier path is electrically coupled between leads 772, 774, and a second amplifier path is electrically coupled between leads 773, 775). Accordingly, leads 772-775 may correspond to terminals 172-175 of the RF circuit 100 of FIG. 1, and input/output RF signal lines 730, 731, 738, 739 may correspond to input/output RF signal lines 130, 131, 138, 139 of the RF circuit 100 of FIG. 1.

As mentioned above, the RF circuit 700 also includes four DC bias lines 732, 735, 750, 759 coupled to the input/output RF signal lines 730, 731, 738, 739. For example, the DC bias lines 732, 735, 750, 759 may correspond to DC bias lines 132, 135, 150, 159 of the RF circuit 100 of FIG. 1. As with the previously-described embodiments of DC bias lines 232, 250 (FIG. 2), each of DC bias lines 732, 735, 750, 759 includes a first section 733, 736, 751, 760, which may be a quarter wave transmission line. Further, each DC bias line 732, 735, 750, 759 may include one or more resonant circuits and additional transmission line sections, as previously described. In any event, and according to an embodiment, conductive material voids 734, 737, 752, 761 in the ground plane 715 are present in portions of the RF substrate 710 below each of the DC bias lines 732, 735, 750, 759 (or more specifically sections 733, 736, 751, 760), in order to increase the impedance of the DC bias lines 732, 735, 750, 759 to RF signals.

In the embodiments described in conjunction with FIGS. 2-7, the DC bias lines (e.g., DC bias lines 232, 250, 732, 735, 750, 751) couple directly with the input/output RF signal lines (e.g., input/output RF signal lines 230, 238, 730, 731, 738, 739). Accordingly, the RF devices 270, 770 do not include leads configured to receive DC bias voltages. In alternate embodiments, and as also mentioned above, an RF device may include dedicated leads (e.g., corresponding to DC bias terminals 176-179, FIG. 1) that are configured to receive and provide gate and drain DC bias voltages to the RF circuitry within the device (e.g., to transistors 166, 167, FIG. 1).

For example, an embodiment of such an RF device is depicted in FIG. 8, which is a top view of an RF circuit 800 that includes an eight-lead RF device 870, which includes four input/output RF signal leads 872, 873, 874, 875, and four DC bias leads 876, 877, 878, 879. In addition, the RF circuit 800 includes an RF substrate 810 to which the RF device 870 is coupled, where the RF substrate 810 includes two input RF signal lines 830, 831, two output RF signal lines 838, 839, and four DC bias lines 832, 835, 850, 859 that are not directly coupled to the input/output RF signal lines 830, 831, 838, 839. Again, many of the features of RF circuit 800 are substantially similar to analogous features of FIGS. 2-5, and for the purpose of brevity, many details regarding analogous features are not repeated in the description of FIG. 8. It is to be understood that those details also apply to the features of FIG. 8. In addition, the various alternate embodiments described in conjunction with FIGS. 2-5 also apply to the RF circuit 800 of FIG. 8.

RF substrate 810 is a multi-layer substrate, the stackup of which includes at least a first conductive layer (analogous to layer 312 and from which signal and bias lines 830, 831, 832, 835, 838, 839, 850, 859 are formed), a first dielectric material (analogous to dielectric material 314), a second conductive layer (analogous to layer 316), and a second dielectric material (analogous to dielectric material 318). The second conductive layer (or inter-dielectric conductive layer) provides a ground plane 815, the footprint of which is indicated with shading in FIG. 8. Conductive vias 880 may be electrically coupled to the ground plane 815, and may extend through the second dielectric material to the bottom substrate surface. The RF substrate 810 may be coupled to a base plate 822 (analogous to base plate 222).

The RF circuit 800 also includes an RF device 870 with eight leads 872-879, which is mounted to a mounting area 820 of the substrate 810. More specifically, the RF device 870 may be inserted into an opening in the substrate 810 so that a flange (not illustrated) of the RF device 870 may be electrically and thermally coupled to a base plate 822 that supports the substrate 810. Leads 872, 873, 874, 875 of the RF device 870 are electrically coupled to a first input RF signal line 830, a second input RF signal line 831, a first output RF signal line 838, and a second output RF signal line 839, respectively. The RF device 870 may, for example, include RF circuitry corresponding to two amplifier paths (e.g., amplifier paths 162, 163, FIG. 1), where an amplifier path is electrically coupled between each pair of input/output RF leads (e.g., a first amplifier path is electrically coupled between leads 872, 874, and a second amplifier path is electrically coupled between leads 873, 875). Accordingly, leads 872-875 may correspond to terminals 172-175 of the RF circuit 100 of FIG. 1, and input/output RF signal lines 830, 831, 838, 839 may correspond to input/output RF signal lines 130, 131, 138, 139 of the RF circuit 100 of FIG. 1.

!As mentioned above, the RF circuit 800 also includes four DC bias lines 832, 835, 850, 859. In contrast with the embodiments described in conjunction with FIGS. 2-7, each of the DC bias lines 832, 835, 850, 859 is coupled to one of the DC bias terminals 876-879, rather than being directly coupled to the input/output RF signal lines 830, 831, 838, 839. For example, the DC bias lines 832, 835, 850, 859 may correspond to DC bias lines 133, 136, 151, 160 of the RF circuit 100 of FIG. 1, and the DC bias terminals 876-879 may correspond to bias terminals 176-179 of the RF circuit 100 of FIG. 1. As with the previously-described embodiments of DC bias lines 232, 250 (FIG. 2), each of DC bias lines 832, 835, 850, 859 includes a first section 833, 836, 851, 860, which may be a quarter wave transmission line. Further, each DC bias line 832, 835, 850, 859 may include one or more resonant circuits and additional transmission line sections, as previously described. In any event, and according to an embodiment, conductive material voids 834, 837, 852, 861 in the ground plane 815 are present in portions of the RF substrate 810 below each of the DC bias lines 832, 835, 850, 859 (or more specifically sections 833, 836, 851, 860), in order to increase the impedance of the DC bias lines 832, 835, 850, 859 to RF signals.

Figure 9:
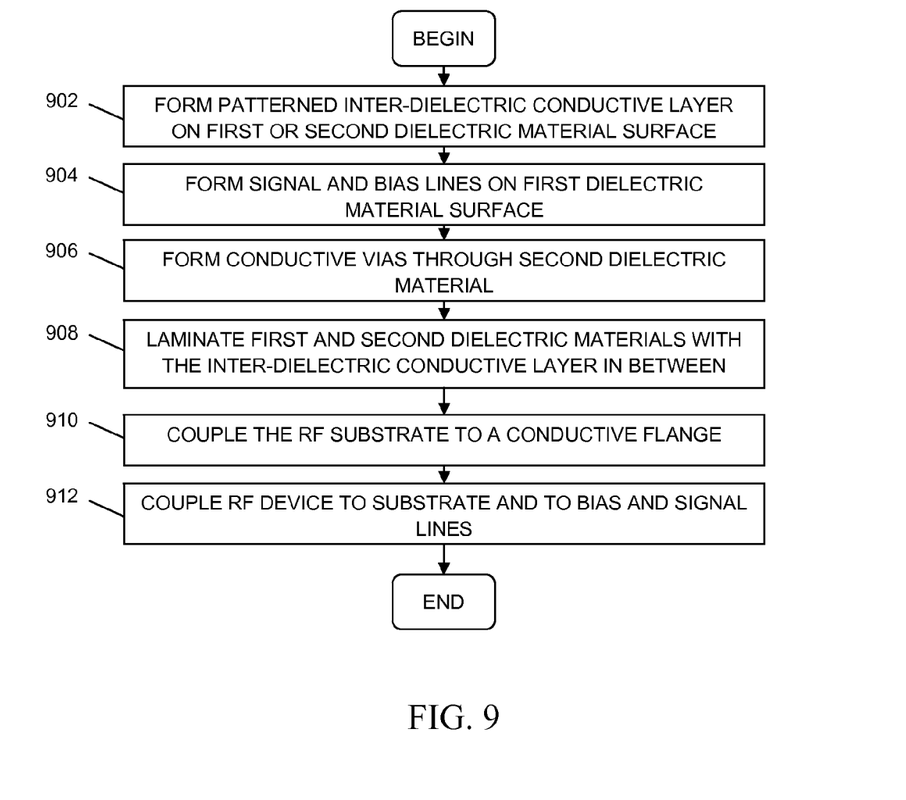
FIG. 9 is a flowchart of a method for manufacturing an RF circuit, in accordance with an example embodiment.

FIG. 9 is a flowchart of a method for manufacturing an RF circuit (e.g., RF circuit 200, 700, 800, FIGS. 2, 7, 8), in accordance with an example embodiment. The method begins by fabricating an RF substrate (e.g., RF substrate 210, 710, 810, FIGS. 2, 7, 8). To fabricate the RF substrate, in block 902, a patterned inter-dielectric conductive layer (e.g., conductive layer 316, FIG. 3) may be formed on the surface of either a first dielectric material (e.g., dielectric material 314, FIG. 3) or a second dielectric material (e.g., dielectric material 318, FIG. 3). According to an embodiment, the patterned inter-dielectric conductive layer corresponds to a ground plane (e.g., ground plane 215, 715, 815, FIGS. 2-8), and includes conductive material voids (e.g., voids 234, 252, 734, 737, 752, 761, 834, 837, 852, 861, FIGS. 2, 7, 8) in areas over which portions of DC bias lines ultimately will be formed.

In block 904, various input/output RF signal lines and DC bias lines (e.g., RF signal lines 230, 238, 730, 731, 738, 739, 830, 831, 838, 839, and DC bias lines 232, 250, 732, 735, 750, 759, 832, 835, 850, 859, FIGS. 2, 7, 8) are formed on a surface of the first dielectric material that will be opposite the surface that contacts the patterned inter-dielectric conductive layer. For example, the input/output RF signal lines and DC bias lines may be formed as portions of another patterned conductive layer (e.g., conductive layer 312, FIG. 3). According to an embodiment, resonant circuits in the form of radial stubs (e.g., radial stub 260, FIG. 2) may be formed simultaneously with the formation of the DC bias lines, where the radial stubs are coupled with the DC bias lines, as described previously. In an alternate embodiment, the radial stubs may be excluded. In such an embodiment, other components (e.g., capacitor 660, FIG. 6) may be coupled at a later fabrication stage to the DC bias lines in order to provide the resonant circuits.

In block 906, conductive vias (e.g., vias 280, 780, 880, FIGS. 2, 7, 8) may be formed through the second dielectric material (e.g., dielectric material 318, FIG. 3) in locations that will contact the patterned inter-dielectric conductive layer. In addition, an additional conductive layer (e.g., conductive layer 320, FIG. 3) may be formed on a surface of the second dielectric material that will be opposite the surface that contacts the patterned inter-dielectric conductive layer. In an alternate embodiment, the additional conductive layer may be excluded from the RF substrate.

In block 908, the first and second dielectric materials are laminated together with the inter-dielectric conductive layer between the first and second dielectric materials. This completes formation of the RF substrate. A mounting area (e.g., mounting area 220, 720, 820, FIGS. 2, 7, 8) may then be prepared, for example, by forming an opening through the RF substrate, where the opening is sized to accept an RF device (e.g., RF device 270, 770, 870, FIGS. 2, 7, 8). In an alternate embodiment, preparation of a mounting area may include forming an opening through the RF substrate, and inserting a conductive coin into the opening. In still another alternate embodiment, preparation of the mounting area may include forming conductive vias between the top and bottom surfaces of the RF substrate.

In block 910, the RF substrate may be coupled to a conductive flange (e.g., conductive flange 222, 722, 822, FIGS. 2, 7, 8). For example, the RF substrate may be coupled to the conductive flange with solder, conductive epoxy, or some other means. In block 912, an RF device (e.g., RF device 270, 770, 870, FIGS. 2, 7, 8) is mechanically and electrically coupled to the RF substrate and to the various RF signal lines and DC bias lines. Other components also may be coupled to the RF substrate to complete the RF circuit.

An embodiment of an RF circuit includes a first dielectric material having first and second surfaces, a first conductive layer over the first surface of the first dielectric material, a second conductive layer over the second surface of the first dielectric material, and a second dielectric material over the second conductive layer. The first dielectric material has a first dielectric constant, and the second dielectric material has a second dielectric constant that is different from the first dielectric constant. The first conductive layer includes a plurality of conductive features that include a signal line and a bias line. The signal line has a first end and a second end, and the bias line has a first section with a first end and a second end. The second conductive layer includes a ground plane, and the signal line is formed directly over the ground plane. A conductive material void is present in the second conductive layer, and the first section of the first bias line is aligned with the conductive material void. The RF circuit further includes a mounting area for an RF device. The first end of the signal line and the first end of the first section of the bias line are located proximate to the mounting area to enable the signal line and the bias line to be electrically coupled with one or more leads of the RF device.

An embodiment of a method for forming an RF circuit includes laminating together a substrate that includes a first dielectric material, a first conductive layer, and a second dielectric material. The first dielectric material has first and second surfaces and a first dielectric constant. The second dielectric material has first and second surfaces and a second dielectric constant that is different from the first dielectric constant. The first conductive layer is between the first surfaces of the first and second dielectric materials, and the first conductive layer includes a ground plane and a conductive material void. The method further includes forming a second conductive layer over the second surface of the first dielectric material. The second conductive layer includes a plurality of conductive features that include a signal line and a bias line. The signal line has a first end and a second end, and the signal line is formed directly over the ground plane. The bias line has a first section with a first end and a second end, and the first section of the bias line is aligned with the conductive material void. The substrate includes a mounting area for an RF device, and the first end of the signal line and the first end of the bias line are located proximate to the mounting area to enable the signal line and the bias line to be electrically coupled with one or more leads of the RF device.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) circuit comprising:
   a first dielectric material having first and second surfaces and a first dielectric constant;
   a first conductive layer over the first surface of the first dielectric material, wherein the first conductive layer includes a plurality of conductive features that include a signal line and a bias line, wherein the signal line has a first end and a second end, and the bias line has a first section with a first end and a second end, and a characteristic impedance of the bias line is in a range of 75 ohms to 300 ohms at a frequency in a range of 800 megahertz to 6.0 gigahertz;
   a second conductive layer over the second surface of the first dielectric material, wherein the second conductive layer includes a ground plane, and the signal line is formed directly over the ground plane with the first dielectric material disposed therebetween, and wherein a conductive material void is present in the second conductive layer, and the first section of the bias line is aligned with the conductive material void;
   a second dielectric material over the second conductive layer and in contact with the second surface of the first dielectric material through the conductive material void, wherein the second dielectric material has a second dielectric constant that is different from the first dielectric constant; and
   a mounting area for an RF device, wherein the first end of the signal line and the first end of the first section of the bias line are located proximate to the mounting area to enable the signal line and the bias line to be electrically coupled with one or more leads of the RF device.

2. The RF circuit of claim 1, wherein the second dielectric constant is at least 50 percent less than the first dielectric constant.

3. The RF circuit of claim 1, wherein:
   the first dielectric constant is in a range of 4.0 to 12.0; and
   the second dielectric constant is in a range of 1.0 to 4.0.

4. The RF circuit of claim 1, further comprising:
   a conductive structure extending between first and second surfaces of the second dielectric material, wherein a first end of the conductive structure is electrically coupled to the ground plane; and
a third conductive layer coupled to the second surface of the second dielectric material and electrically coupled to a second end of the conductive structure.

5. The RF circuit of claim 4, wherein the conductive structure includes a conductive via.

6. The RF circuit of claim 1, wherein the first section of the bias line has a first width, and wherein the conductive material void has a second width that is at least as wide as the first width.

7. The RF circuit of claim 6, wherein the second width is at least 20 percent wider than the first width.

8. The RF circuit of claim 1, wherein the first end of the first section of the bias line is coupled to the first end of the signal line, and the first end of the signal line is configured to be coupled to a lead of the one or more leads of the RF device.

9. The RF circuit of claim 8, further comprising:
the RF device coupled to the mounting area, wherein the RF device includes a packaged power RF transistor including the lead of the one or more coils.

10. The RF circuit of claim 1, wherein:
the first end of the first section of the bias line is configured for a first lead of the one or more leads of the RF device to be coupled thereto; and
the first end of the signal line is configured for a second lead of the one or more leads of the RF device to be coupled thereto.

11. The RF circuit of claim 10, further comprising:
the RF device coupled to the mounting area, wherein the RF device includes a packaged power RF transistor including the first lead and the second lead.

12. A radio frequency (RF) circuit comprising:
a first dielectric material having first and second surfaces and a first dielectric constant;
a first conductive layer over the first surface of the first dielectric material, wherein the first conductive layer includes a plurality of conductive features that include a signal line and a bias line, wherein the signal line has a first end and a second end, and the bias line has a first section with a first end and a second end, and wherein the first section of the bias line is a quarter wave transmission line;
a second conductive layer over the second surface of the first dielectric material, wherein the second conductive layer includes a ground plane, and the signal line is formed directly over the ground plane with the first dielectric material disposed therebetween, and wherein a conductive material void is present in the second conductive layer, and the first section of the bias line is aligned with the conductive material void;
a second dielectric material over the second conductive layer, wherein the second dielectric material has a second dielectric constant that is different from the first dielectric constant; and
a mounting area for an RF device, wherein the first end of the signal line and the first end of the first section of the bias line are located proximate to the mounting area to enable the signal line and the bias line to be electrically coupled with one or more leads of the RF device.

13. The RF circuit of claim 12, wherein the bias line further comprises:
a resonant circuit coupled to the second end of the first section of the bias line.

14. The RF circuit of claim 13, wherein the resonant circuit includes a radial stub formed from a portion of the first conductive layer.

15. The RF circuit of claim 13, wherein the resonant circuit includes a discrete capacitor that includes a terminal that is electrically coupled to the second end of the first section of the bias line.

16. A radio frequency (RF) circuit comprising:
a first dielectric material having first and second surfaces and a first dielectric constant, wherein the first dielectric material is selected from ceramic-filled polytetrafluoroethylene (PTFE), ceramic-filled PTFE with woven glass, ceramic-filled hydrocarbon, ceramic-filled hydrocarbon with woven glass, random glass filled PTFE, PTFE with woven glass, PTFE with micro glass fiber, e-fibre glass, and high performance FR4;
a first conductive layer over the first surface of the first dielectric material, wherein the first conductive layer includes a plurality of conductive features that include a signal line and a bias line, wherein the signal line has a first end and a second end, and the bias line has a first section with a first end and a second end;
a second conductive layer over the second surface of the first dielectric material, wherein the second conductive layer includes a ground plane, and the signal line is formed directly over the ground plane with the first dielectric material disposed therebetween, and wherein a conductive material void is present in the second conductive layer, and the first section of the bias line is aligned with the conductive material void;
a second dielectric material over the second conductive layer, wherein the second dielectric material has a second dielectric constant that is different from the first dielectric constant, wherein the second dielectric material is selected from PTFE, ceramic-filled PTFE, ceramic-filled PTFE with woven glass, ceramic-filled hydrocarbon, ceramic-filled hydrocarbon with woven glass, random glass filled PTFE, PTFE with woven glass, PTFE with micro glass fiber, high performance FR4, and air; and
a mounting area for an RF device, wherein the first end of the signal line and the first end of the first section of the bias line are located proximate to the mounting area to enable the signal line and the bias line to be electrically coupled with one or more leads of the RF device.

17. A method for forming a radio frequency (RF) circuit, the method comprising:
laminating together a substrate that includes a first dielectric material, a first conductive layer, and a second dielectric material, wherein
the first dielectric material has first and second surfaces and a first dielectric constant,
the second dielectric material has first and second surfaces and a second dielectric constant that is different from the first dielectric constant, and
the first conductive layer is between the first surfaces of the first and second dielectric materials, and the first conductive layer includes a ground plane and a conductive material void, and the first and second dielectric materials contact each other through the conductive material void; and
forming a second conductive layer over the second surface of the first dielectric material, wherein the second conductive layer includes a plurality of conductive features that include a signal line and a bias line, wherein the signal line has a first end and a second end, and the signal line is formed directly over the ground plane with the first dielectric material disposed therebetween, and the bias line has a first section with a first end and a second end, the first section of the bias line is aligned with the conductive material void, and a characteristic impedance of the bias line is in a range of 75 ohms to 300 ohms at a frequency in a range of 800 megahertz to 6.0 gigahertz, and wherein the substrate includes a mounting area for an RF device, wherein the first end of the signal line and the first end of the bias line are located proximate to the mounting area to enable the signal line and the bias line to be electrically coupled with one or more leads of the RF device.

18. The method of claim 17, wherein the RF device includes a packaged power RF transistor, and the method further comprises:

coupling the packaged power RF transistor to the mounting area, wherein the one or more leads are electrically coupled to the first end of the signal line and to the first end of the bias line.

19. The method of claim 17, further comprising:

coupling a resonant circuit to the second end of the first section of the bias line, wherein the resonant circuit includes a component selected from a discrete capacitor and a radial stub formed from a portion of the second conductive layer.

* * * * *